United States Patent
Fujikura

(10) Patent No.: US 7,932,107 B2
(45) Date of Patent: Apr. 26, 2011

(54) METHOD FOR GROWING NITRIDE SEMICONDUCTOR

(75) Inventor: Hajime Fujikura, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 187 days.

(21) Appl. No.: 12/000,458

(22) Filed: Dec. 12, 2007

(65) Prior Publication Data
US 2008/0182426 A1   Jul. 31, 2008

(30) Foreign Application Priority Data
Dec. 15, 2006 (JP) .................. 2006-338872

(51) Int. Cl.
H01L 21/00 (2006.01)
C30B 25/00 (2006.01)
(52) U.S. Cl. . 438/22; 117/84; 257/E21.24; 257/E21.148
(58) Field of Classification Search .......... 438/45–47, 438/478, 513, 26, 28–29, 94, 776, 680, 687, 438/22, 485; 117/92, 952, 200; 257/E21.108, 257/613, 64, E21.24, E21.143, E21.148, 257/E21.006; 118/8, 84, 95
See application file for complete search history.

(56) References Cited

U.S. PATENT DOCUMENTS

| | | | |
|---|---|---|---|
| 5,290,393 A | 3/1994 | Nakamura | |
| 5,637,146 A * | 6/1997 | Chyi | 117/200 |
| 6,593,016 B1 * | 7/2003 | Chiyo et al. | 428/698 |
| 6,841,274 B2 * | 1/2005 | Ueno et al. | 428/698 |
| 2002/0028291 A1 * | 3/2002 | Shibata et al. | 427/255.39 |
| 2004/0206967 A1 * | 10/2004 | Oshima et al. | 257/85 |
| 2005/0042789 A1 * | 2/2005 | Fujikura et al. | 438/47 |

FOREIGN PATENT DOCUMENTS

| | | |
|---|---|---|
| JP | 7-54806 | 6/1995 |
| JP | 8-8217 | 1/1996 |
| JP | 11-87253 | 3/1999 |
| JP | 2001-15443 | 1/2001 |
| JP | 2001-217193 | 8/2001 |
| JP | 2005251444 A * | 9/2005 |

OTHER PUBLICATIONS

Uchida et al., "Nitridation process of sapphire substrate surface and its effect on the growth of GaN", 1996, J. Applied Physics, vol. 79, No. 1, pp. 3487-3491.*
Akasaki et al., "Effects of AlN buffer layer on crystallographic structure and on electric and optical properties of GaN and Ga 1-x AlxN (0<x ≦0.4) films grown on sapphire substrate by MOVPE".*
Widmann et al., "Low temperature sapphire nitridation: A clue to optimize GaN layers grown . . . ", 1996, J. Applied Physics, vol. 79, No. 7, pp. 3487-3491.*

* cited by examiner

Primary Examiner — Thomas L Dickey
Assistant Examiner — Nikolay Yushin
(74) Attorney, Agent, or Firm — McGinn IP Law Group, PLLC

(57) ABSTRACT

A method for growing a nitride semiconductor has a first step for forming a surface reformation layer on a sapphire substrate, a second step for raising a temperature of the sapphire substrate with the surface reformation layer formed thereon up to a growth temperature of the nitride semiconductor in an atmosphere including ammonia, and a third step for growing a nitride semiconductor layer on a surface of the surface reformation layer. Alternatively, the second step is conducted in an atmosphere including an inert gas, or an atmosphere including the inert gas and hydrogen at a concentration of 10% or less relative to the inert gas.

20 Claims, 6 Drawing Sheets

1 SAPPHIRE SUBSTRATE

2 SURFACE REFORMATION LAYER
1

3 GaN LAYER
2
1

US 7,932,107 B2

METHOD FOR GROWING NITRIDE SEMICONDUCTOR

The present application is based on Japanese patent application No. 2006-338872 filed on Dec. 15, 2006, the entire contents of which are incorporated herein by reference.

BACKGROUND OF THE INVENTION

1. Field of the Invention

The present invention relates to a method for growing a nitride semiconductor layer on a sapphire substrate.

2. Description of the Related Art

Nitride semiconductors have been studied, developed, and put into practical use as a material for light emitting diodes (LEDs) to emit high-brightness ultraviolet light, blue light, green light and the like, and for high electron mobility transistors (HEMTs) used for high power application or the like.

In growing a crystal of the nitride semiconductor, a single-crystal substrate formed of sapphire or silicon carbide as a hetero-substrate is mainly used. Especially, the sapphire substrate is widely used because it is stable at ordinary crystal growth temperature (about 1000° C.) of the nitride semiconductor and can easily provide for a substrate with a large diameter at low cost.

As a method for growing the nitride semiconductor on the sapphire substrate, "two step growth method" using a metal-organic vapor phase epitaxy (MOVPE) method is known (See JP-B-H08-8217).

FIGS. 5A to 5D show a crystal growth method based on the two step growth method, where FIG. 5A shows a hydrogen cleaning step, FIG. 5B shows a growth step for a low temperature growth buffer layer, FIG. 5D shows a growth step for a single-crystal nucleus, and FIG. 5D shows a growth step for a GaN layer. Furthermore, FIG. 6 is a diagram for showing the temperature sequence in the two step growth method, wherein (a) through (d) correspond to the respective steps in FIGS. 5A through FIG. 5D.

The two step growth method is conducted by the following steps:

(a) The surface of a sapphire substrate 101 is sprayed with hydrogen gas 102 at about 1200° C. to clean the substrate surface (hydrogen cleaning).

(b) A low temperature growth buffer layer 103 formed of GaN, AlN or the like is grown on the sapphire substrate 101 in atmosphere of 500 to 600° C. In this step, since the crystal growth temperature is lower than the melting point of GaN, AlN or the like, the low temperature growth buffer layer 103 is grown in polycrystalline form.

(c) The sapphire substrate 101 and the low temperature growth buffer layer 103 are heated (annealed) to about 1100° C., whereby single-crystal nuclei 104 are partially formed in the low temperature growth buffer layer 103.

(d) In atmosphere of about 1100° C., a GaN layer (epitaxial layer) 105 is grown on the low temperature growth buffer layer 103 and the single-crystal nuclei 104 which function as a crystal nucleus.

In a conventional growth method prior to the two step growth method, a nitride semiconductor is directly grown on the sapphire substrate at high temperature of 1000° C. or more. However, it is difficult to obtain a continuous nitride semiconductor film which covers continuously the whole surface of the sapphire substrate. Even if the continuous film is obtained, the dislocation density of the nitride semiconductor layer must be as high as about $10^{10}$ to $10^{11}$ cm$^{-2}$. The dislocation defect acts as a nonradiative recombination center or a scattering center to electron or hole, so that a semiconductor device fabricated with the nitride semiconductor produced by the conventional method cannot have device characteristics sufficient for practical use.

By using the two step growth method, a nitride semiconductor layer useful for a device can be first grown on the sapphire substrate. For example, the dislocation density of the nitride semiconductor layer can be reduced to $10^9$ cm$^{-2}$ or so, so that application of the nitride semiconductor to various devices can be finally realized.

However, the two step growth method has the following drawbacks.

(1) The two step growth method is low in production efficiency as compared to a conventional crystal growth method for GaAs- or InP-based semiconductor, and the production efficiency thereof is around half that of the conventional method. The conventional crystal growth method is generally conducted by such a simple temperature sequence with a small temperature change that temperature rises from room temperature to 500 to 600° C. (10 minutes), the crystal grows (60 minutes), temperature lowers to room temperature (20 minutes), and the crystal grown is taken out.

In contrast, as shown in FIG. 6, the two step growth method for a nitride semiconductor is conducted by a complicated temperature sequence with a remarkable temperature change where temperature rise/fall is repeated such that temperature rises from room temperature to 1200° C. (30 minutes), hydrogen cleaning is conducted in step (a) (10 minutes), temperature lowers to about 530° C. (40 minutes), a low temperature growth buffer layer is grown in step (b) (1 minute), temperature rises in step (c) (20 minutes), GaN is grown in step (d) (60 minutes), temperature lowers to room temperature (30 minutes), and the GaN grown is taken out. Consequently, the total crystal growth takes three or more hours to lower the production efficiency.

For instance, in case of growing a GaAs layer on a GaAs substrate by means of mass-production equipment, if the growth time is one hour, 10 minutes is required for temperature rise, one hour for the growth, and 20 minutes for temperature fall, so that 1.5 hours are totally required. In contrast, in case of growing GaN on a sapphire substrate as shown in FIG. 6, if the growth time is one hour, the total required time is 191 minutes (i.e., 3 hours and 11 minutes)=(30 minutes+10 minutes+40 minutes+1 minute+20 minutes+60 minutes+30 minutes). Thus, the crystal growth time is remarkably long as compared to 90 minutes in the conventional method, so that the production efficiency of the two step growth method becomes half or less that of the conventional method.

(2) The stability and reproducibility of the crystal growth is not good. In this regard, the inventor researches about the reproducibility in thickness and X-ray diffraction half width of the GaN layer by the two step growth method as below.

FIG. 7 shows the thickness characteristics of GaN layers in the case that GaN growth is conducted 100 times by the two step growth method under the same conditions, and FIG. 8 shows the X-ray diffraction half width characteristics of GaN layers in the case that the GaN growth is conducted 100 times by the two step growth method under the same conditions. In this research, the temperature sequence is used as shown in FIG. 6.

In order to obtain the characteristics of FIGS. 7 and 8, the GaN growth is conducted by steps as shown in FIGS. 5A to 5D under the next conditions. A low temperature growth buffer layer 103 as shown in step (b) is grown by supplying trimethyl gallium (TMG) at 382 μmol/min, ammonia at 10 slm, and carrier gases of hydrogen and nitrogen at 40 slm and 100 slm, respectively, where the low temperature growth buffer layer with a thickness of about 25 nm is grown for 80 sec. The annealing treatment in step (c) is conducted by supplying 20 slm ammonia, 30 slm hydrogen, and 50 slm nitrogen, and heating the sapphire substrate 101 up to 1100° C. Then, a GaN layer 105 as shown in step (d) is grown such that, when the substrate temperature rises to 1100° C., TMG is supplied at 846 μmol/min for 30 min to grow the GaN. After 30 min, the flow rate of TMG is reduced to zero to complete the growth. Then, the substrate temperature lowers to room temperature, and the substrate is taken out. The average thickness of the GaN layers 105 obtained in step (d) is 1.5 μm, and the average X-ray diffraction half width thereof is 329 sec.

As a result, the characteristics as shown in FIGS. 7 and 8 are obtained. As shown in FIGS. 7 and 8, it is found that both of the thickness and the X-ray diffraction half width of the GaN layers produced by the two step growth method vary remarkably (±20% or more relative to the average value) among the growth. Thus, the reducibility and the stability are not good.

The instability of the two step growth method is caused by the low temperature buffer growth in step (b) and the annealing in step (c) where a single-crystal nuclei 104 are formed which act as the growth origin of the GaN layer 105. The single-crystal nuclei 104 are formed by annealing the low temperature growth buffer layer 103. However, as the annealing process proceeds, the low temperature growth buffer layer 103 evaporates gradually. The amount of GaN evaporated in the vicinity of the growth temperature (near 1000° C.) depends exponentially upon the temperature, so that it varies significantly even in slight temperature change. Consequently, reflecting the slight difference of the substrate temperature among the growths, the amount and the density of the single-crystal nuclei 104 vary in the initial growth stage, whereby the above-mentioned instability is caused.

More specifically, at high temperature of 1000° C. or more, it is hard to deposit the GaN directly on the surface of the sapphire substrate and it starts growing at the single-crystal nuclei 104 as the growth origin. Thus, since the growth rate of the GaN layer in the initial growth stage depends upon the initial density of the single-crystal nuclei 104, variation in the density of the single-crystal nuclei 104 is developed as variation in the final film thickness shown in FIG. 7.

On the other hand, the fact that the X-ray diffraction half width varies remarkably means that the dislocation density of the GaN layer 105 varies significantly. The dislocation is generated inside the single-crystal nucleus as the growth origin or at the boundary where nuclei are combined each other during the growth. Accordingly, as the density of the single-crystal nuclei 104 increases, the dislocation density increases. Thus, when the density of the single-crystal nuclei 104 as the growth origin varies, the dislocation density of the GaN layer 105 grown on the single-crystal nuclei also varies. As a result, the X-ray diffraction half width varies as shown in FIG. 8.

As a method for overcoming such disadvantage of the two step growth method as mentioned above, there is known a method that a sapphire substrate is heated in a raw material gas containing nitrogen to form a nitrided region on the surface of the sapphire substrate, and a GaN layer is then grown on the nitrided region (See JP-B-H07-54806 and JP-A-2001-15443). Where the inventor conducts the above method, it is confirmed that the production efficiency is improved as compared to that of the two step growth method. Namely, the growth sequence thereof is simplified, as compared to that of the two step growth method, such that temperature rises from room temperature to 1000° C. (30 minutes), thermal nitridation treatment is conducted in ammonia (30 minutes), GaN is grown (60 minutes), and temperature lowers to room temperature (30 minutes). As a result, the total growth time is 2.5 hours that is shorter than 3 hours and 11 minutes by the two step growth method. Also, it is confirmed that the nitrided region on the surface of the sapphire substrate functions as a nucleus as the GaN growth origin to allow the growth of the GaN layer by this method.

However, the thickness and the X-ray diffraction half width of the resulting GaN layer by the above method (using the nitrided region) only exhibit the same poor reproducibility as that by the two step growth method. This is because the thickness of the nitrided regions formed on the surface of the sapphire by the thermal nitridation varies in the range of from 5 to 35 nm among the growths. Although the cause of the variation in thicknesses of the nitrided regions among the growths is not clear, the variation may be caused by the thermal instability of the nitride formed on the sapphire surface by the thermal nitridation.

Instead of nitriding thermally the surface of the sapphire substrate, a method is known in which the sapphire surface is nitrided with plasma such as nitrogen gas (See JP-A-H11-87253 and JP-A-2001-217193). Where the inventor conducts the above method, it is found that GaN with a flat surface can be obtained by growing GaN on the nitrided surface by a plasma CVD method (with raw materials of TMG and nitrogen).

However, the X-ray diffraction half width of the resulting GaN layer is around 1000 seconds which is significantly large compared to 329 seconds by the two step growth method. This means that the dislocation density of the GaN layer by the above method is remarkably higher than that by the two step growth method, which causes the deterioration in reproducibility and stability.

If nitrogen radical exists on the surface of GaN during the growth of the GaN layer, the nitrogen radical is combined instantly with Ga atom dissociated from TMG to deposit GaN since the nitrogen radical is very active. As a consequence, the surface diffusion of the Ga atom on the growth surface is hindered so that the GaN growth rate in lateral direction (direction parallel to the surface) becomes slow. Therefore, a continuous GaN layer covering the whole surface of the sapphire surface can be obtained only when the density of the nuclei as the growth origin formed on the surface of the sapphire substrate by the plasma nitridation is high. Consequently, when the continuous GaN layer can be obtained, the dislocation density must be increased.

In contrast, the MOVPE method used in the two step growth method does not involve any radical hindering the surface diffusion of Ga. Thus, since the lateral growth rate of GaN is high, the continuous GaN layer can be obtained even when the density of single-crystal nuclei is low. Accordingly, the resulting GaN layer can have low dislocation density.

As described above, in the conventional methods for producing a nitride semiconductor, it is very difficult to have stably the thermally-formed nitride on the sapphire substrate. Moreover, where the nitridation on the surface of the sapphire substrate is conducted by plasma and the GaN is grown on the nitrided surface by the plasma CVD method, the property of the resulting GaN crystal is remarkably inferior to that of the conventional two step growth method.

As such, it is impossible to overcome the low production efficiency and the instability in growth which are problematical in the two step growth method, while keeping the film quality of the GaN layer equal to or higher than that obtained by the two step growth method.

SUMMARY OF THE INVENTION

Accordingly, it is an object of the invention is to provide a method for producing a nitride semiconductor by which a GaN layer having the film quality equal to or higher than that of a two step growth method can be grown on a sapphire substrate, and in addition, a high production efficiency and growth stability can be achieved.

(1) According to one embodiment of the invention, a method for growing a nitride semiconductor comprises:

a first step for forming a surface reformation layer on a sapphire substrate;

a second step for raising a temperature of the sapphire substrate with the surface reformation layer formed thereon up to a growth temperature of the nitride semiconductor in an atmosphere including ammonia; and a third step for growing a nitride semiconductor layer on a surface of the surface reformation layer.

(2) According to another embodiment of the invention, a method for growing a nitride semiconductor comprises:

a first step for forming a surface reformation layer on a sapphire substrate;

a second step for raising a temperature of the sapphire substrate with the surface reformation layer formed thereon up to a growth temperature of the nitride semiconductor in an atmosphere including an inert gas, or an atmosphere including the inert gas and hydrogen at a concentration of 10% or less relative to the inert gas; and a third step for growing a nitride semiconductor layer on a surface of the surface reformation layer.

BRIEF DESCRIPTION OF THE DRAWINGS

The invention will be explained in more detail in conjunction with appended drawings, wherein:

FIG. 1A shows a sapphire substrate, FIG. 1B shows a step of growing a surface reformation layer, and FIG. 1C shows a step of growing a GaN layer;

FIG. 2A shows the temperature sequence in a plasma nitridation step, and FIG. 2B shows the temperature sequence in a MOVPE growth step;

FIG. 5A shows a hydrogen cleaning step, FIG. 5B shows a growth step for a low temperature growth buffer layer, FIG. 5C shows a growth step for single-crystal nuclei, and FIG. 5D shows the growth step of a GaN layer;

DESCRIPTION OF THE PREFERRED EMBODIMENTS

Preferred embodiments of the invention will be described hereinafter by referring to the accompanying drawings.

First Embodiment

Method for Producing a Nitride Semiconductor

Figure 1A:
FIGS. 1A to 1C are cross sectional views showing steps in a method for growing a nitride semiconductor in a first preferred embodiment of the invention, where
Figure 1B:
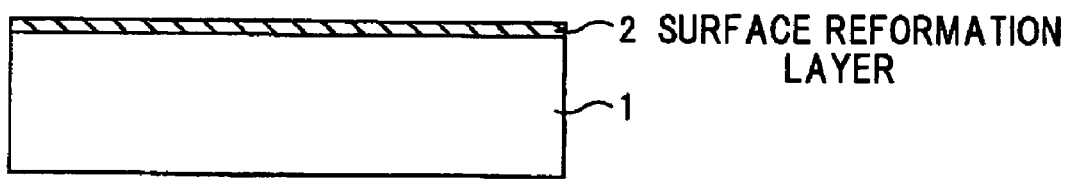
Figure 1C:
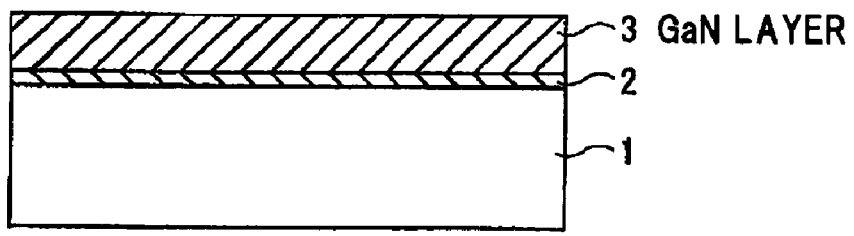
Figure 2A:
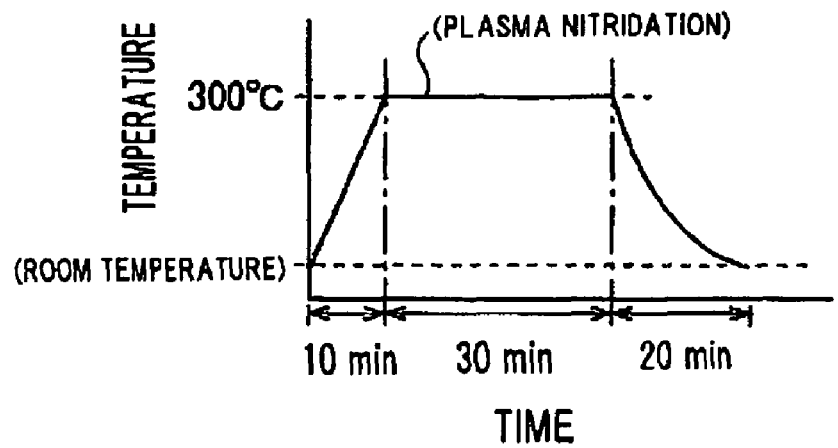
FIGS. 2A and 2B are diagrams showing temperature sequences for the growth method in FIGS. 1A to 1C, where
Figure 2B:
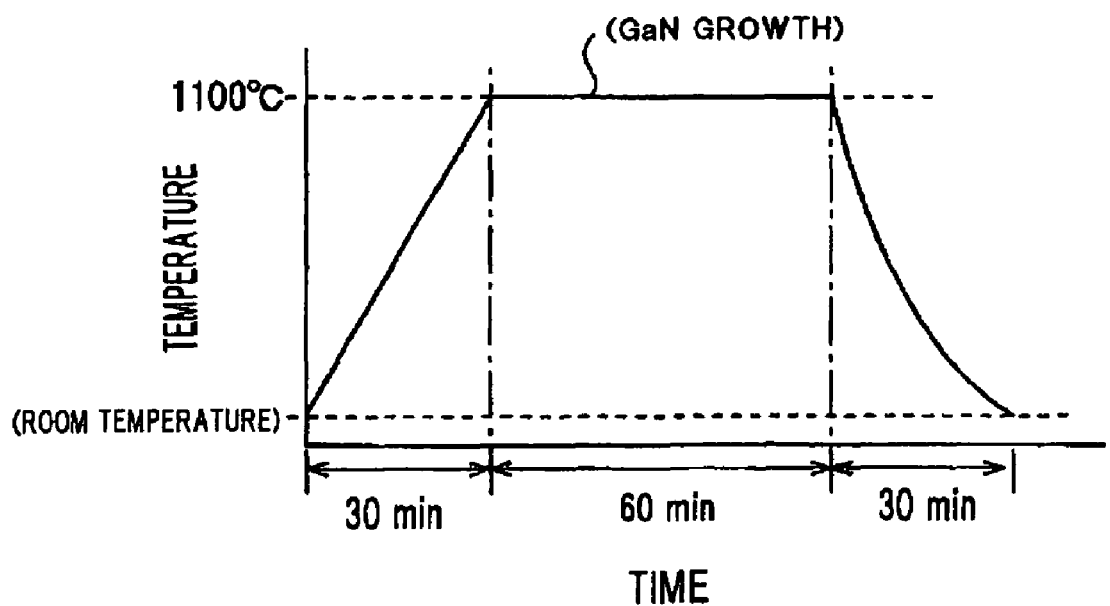

FIGS. 1A to 1C are cross sectional views showing steps in a method for growing a nitride semiconductor in the first preferred embodiment of the invention, where FIG. 1A shows a sapphire substrate, FIG. 1B shows a step of growing a surface reformation layer, and FIG. 1C shows a step of growing a GaN layer. FIGS. 2A and 2B are diagrams showing temperature sequences for the growth method in FIGS. 1A to 1C, where FIG. 2A shows the temperature sequence in a plasma nitridation step, and FIG. 2B shows the temperature sequence in a MOVPE growth step.

First, a C-plane sapphire substrate (hereinafter referred to as simply "sapphire substrate") 1 is introduced into Electron Cyclotron Resonance (ECR) plasma equipment (not shown), a degree of vacuum in the ECR plasma equipment is reduced to $1 \times 10^{-9}$ Torr, and then, the temperature of the sapphire substrate 1 is raised from a room temperature up to 300° C. (FIG. 1A).

Next, nitrogen gas is introduced into the ECR plasma equipment at a predetermined flow rate (for example, 30 sccm), and the degree of vacuum is adjusted to a predetermined value (for example, 7 mTorr. In this condition, a microwave is irradiated (for example, 100 W power) to generate plasma. As a result of the plasma treatment, a surface reformation layer (nitridation layer) 2 having a predetermined thickness (for example, about 3 nm) is formed on the surface of the sapphire substrate 1 (FIG. 1B). The thickness of the surface reformation layer 2 is determined by X-ray reflection coefficient.

It has been found by the inventor that the thickness of the surface reformation layer 2 obtained by nitriding the surface of the sapphire substrate 1 may be controlled with far better reproducibility than that of thermal nitridation. This is because the surface reformation layer 2 formed in the plasma nitridation is not lost by etching, since the nitridation is effected in the plasma nitridation at a lower temperature than that of thermal nitridation. Furthermore, the density of the nitride forming the surface reformation layer 2 may be estimated from the measurement of X-ray reflection coefficient. In this respect, it becomes clear that a higher density is obtained in the nitride according to the plasma nitridation than that of the thermal nitridation, whereby a more compact nitride having high heat resistance is produced.

The inventor studies further the surface reformation layer by changing the temperature of the plasma treatment from a room temperature to 600° C., and changing the power of microwave from 100 to 500 W. As a result, it has been found that the equal results to that of a two step growth method are obtained in the plasma treatment method so far as a treating time is adjusted in every treating temperatures and powers of microwave, and a thickness of the surface reformation layer 2 is controlled in a range of from 1 to 10 nm. When the thickness of a nitrided region is less than 1 nm, a part of the surface reformation layer 2 is etched during the temperature raising step, whereby the stability in growth is damaged. On the other hand, if the thickness of the surface reformation layer 2 is more than 10 nm, the dislocation of the GaN layer grown on the surface reformation layer 2 increases remarkably. This is because the crystallinity on the surface side of the surface reformation layer 2 decreases, if the surface reformation layer 2 has a thick thickness.

Next, as shown in FIG. 2A, the time required for plasma nitridation represents a total of one hour wherein the temperature raising from a room temperature to up to 300° C. (10 minutes)→plasma nitridation treatment (30 minutes)→the temperature reduction up to the room temperature (20 minutes).

Then, the sapphire substrate 1 which has been subjected to the nitridation treatment is introduced into a MOVPE apparatus (not shown) to grow a GaN layer 3 (FIG. 1C). In the growth, first, the MOVPE apparatus is depressurized by means of vacuuming (for example, $5 \times 10^{-2}$ Torr), then, hydrogen is introduced into the apparatus, and the pressure is returned to atmospheric pressure, thereby to clean the atmosphere in the MOVPE apparatus.

Thereafter, the temperature of the sapphire substrate 1 is raised to 1100° C. in an atmosphere containing ammonia ($NH_3$: e.g. 20 slm), hydrogen (e.g. 30 slm), and nitrogen (e.g. 50 slm). Trimethylgallium (TMG) is started to flow at a predetermined flow rate (for example, 846 μmol/min.) at the time when the temperature of the sapphire substrate 1 is reached to 1100° C. to effect the growth of the GaN layer 3. Then, the TMG is stopped to complete the GaN growth.

Thereafter, the substrate temperature is reduced to the room temperature, and the sapphire substrate 1 is taken out from the MOVPE apparatus. The condition after starting the growth of the GaN is the same as that of the above-described two step growth method.

As shown in FIG. 2B, the time required for the MOVPE growth represents a total of two hours wherein the temperature raising from a room temperature to up to 1100° C. (30 minutes)→GaN growth (60 minutes)→the temperature reduction to the room temperature (30 minutes), so that the time required can be remarkably shortened as compared with three hours or more in the two step growth method.

The reason for conducting the temperature raising from the room temperature shown in FIG. 2B in the atmosphere containing ammonia, hydrogen, and nitrogen is to prevent the appearance of a significant fluctuation in the growth condition of the surface reformation layer 2 in every growth steps. As a result of the temperature raising process according to the same manner as that of the two step growth method, the properties of the resulting GaN layer 2 fluctuate significantly in every growth steps. In this respect, when the cause for this instability is investigated, it has been found that the surface reformation layer 2 on the surface of the sapphire substrate 1 is etched with hydrogen existing in the normal MOVPE growth atmosphere during the term wherein the sapphire substrate 1 the surface of which has been nitrided is introduced into a growth apparatus, and the temperature thereof is raised from a room temperature to the growth temperature (about 1100° C.), whereby thicknesses of the surface reformation layer 2 are fluctuated in every growth steps.

Thus, the following countermeasures for preventing the etching in the surface reformation layer 2 are studied:

(1) The temperature is raised in ammonia.
(2) The temperature is raised in an inert gas such as nitrogen (or an inert gas of a low hydrogen concentration).

As a result, it has been found that the stability in the growth can be remarkably improved by either of the countermeasures. Specifically, the fluctuation from the mean value of the thicknesses and X-ray diffraction half widths of the resulting GaN layer 3 is 3% or less, so that it is significantly improved in comparison with the value (±20%) according to a conventional method. More specifically, the mean values of the thicknesses and the X-ray diffraction half widths are substantially equal to or more improved rather than that of the GaN layer 105 according to the two step growth method. Consequently, the GaN layer 3 having the film quality equal to or more than that of the GaN layer 105 according to the two step growth method may be stably grown.

Figure 3:
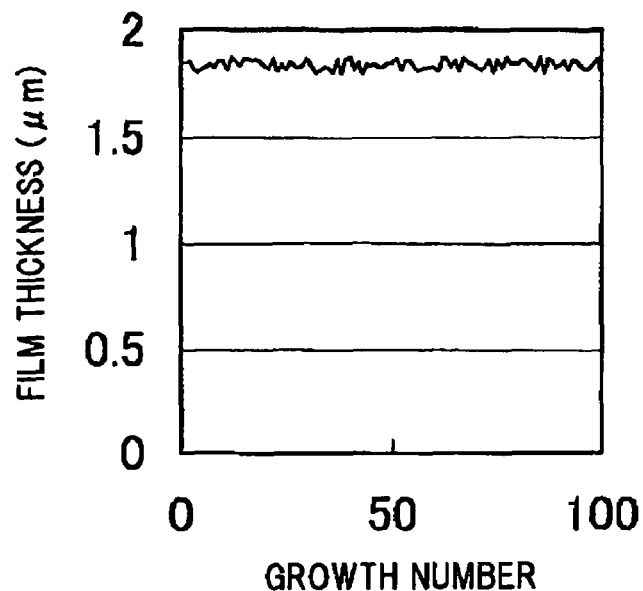
FIG. 3 is a characteristic diagram showing the thickness of GaN layers in the case that the GaN growth is repeated 100 times under the same conditions.
Figure 4:
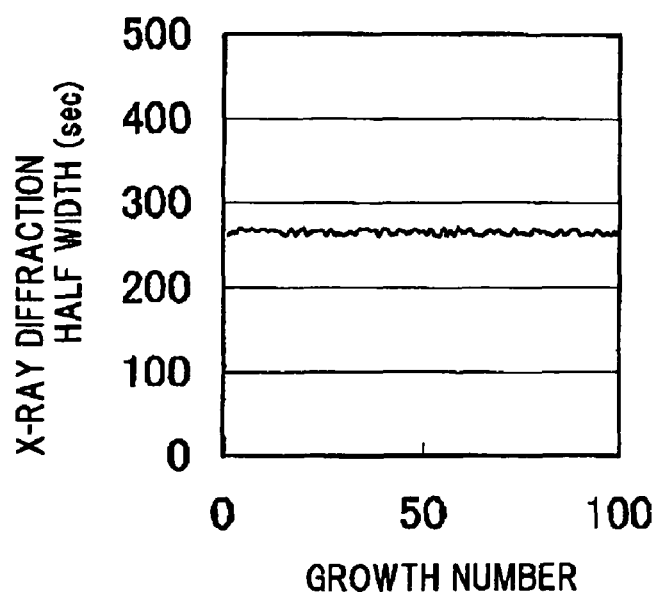
FIG. 4 is a characteristic diagram showing the X-ray diffraction half width of GaN layers in the case that the GaN growth is repeated 100 times under the same conditions.
Figure 5A:
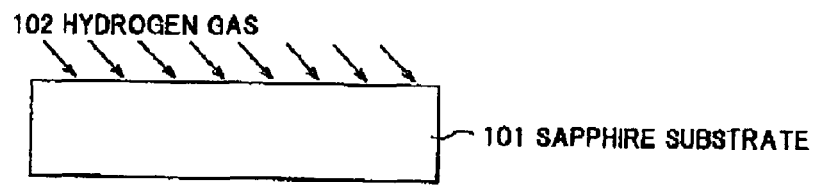
FIGS. 5A to 5D are cross sectional views showing crystal growth steps according to the two step growth method, where
Figure 5B:
Figure 5C:
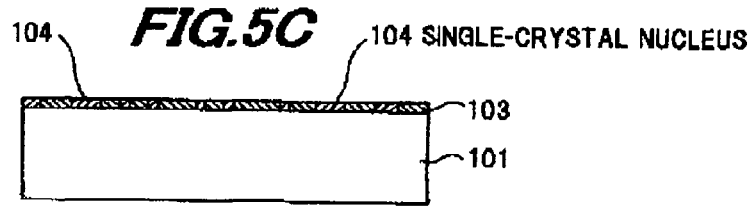
Figure 5D:
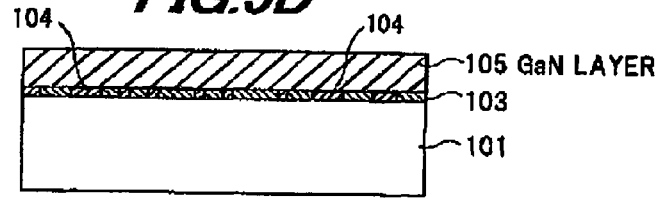
Figure 6:
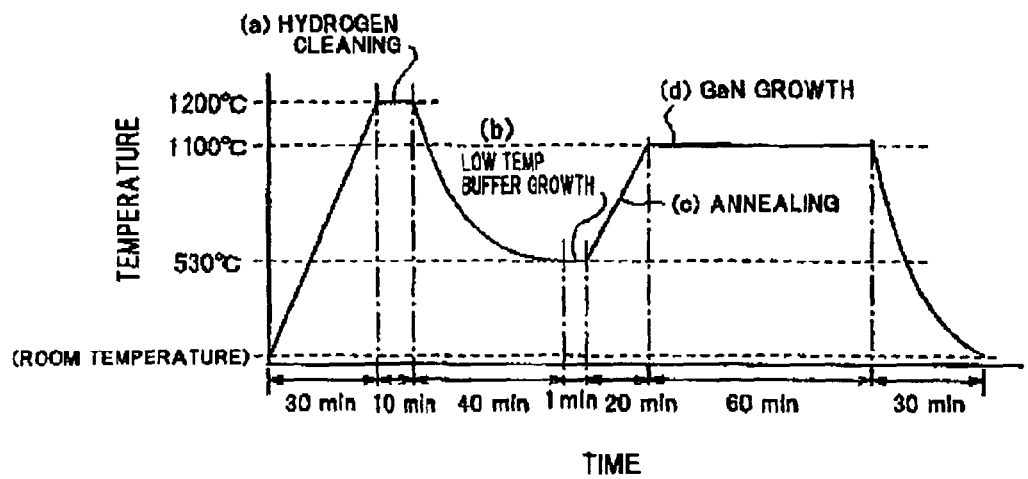
FIG. 6 is a diagram showing a temperature sequence for the two step growth method.

FIG. 3 shows the thickness characteristics of the GaN layer wherein the GaN growth is repeated 100 times in the same condition; and FIG. 4 shows the X-ray diffraction half width characteristics of the GaN layer wherein the GaN growth is repeated 100 times in the same condition.

Figure 7:
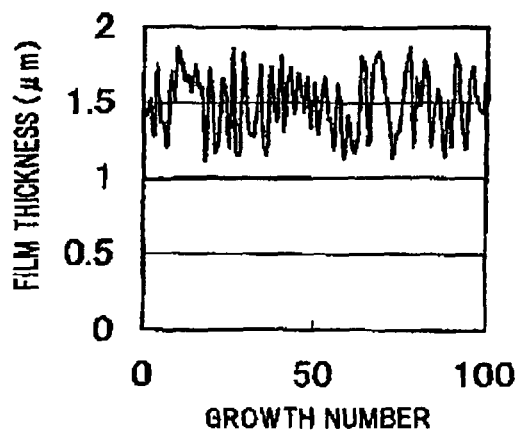
FIG. 7 is a characteristic diagram showing the thickness of GaN layers in the case that the GaN growth is repeated 100 times under the same conditions according to the two step growth method.
Figure 8:
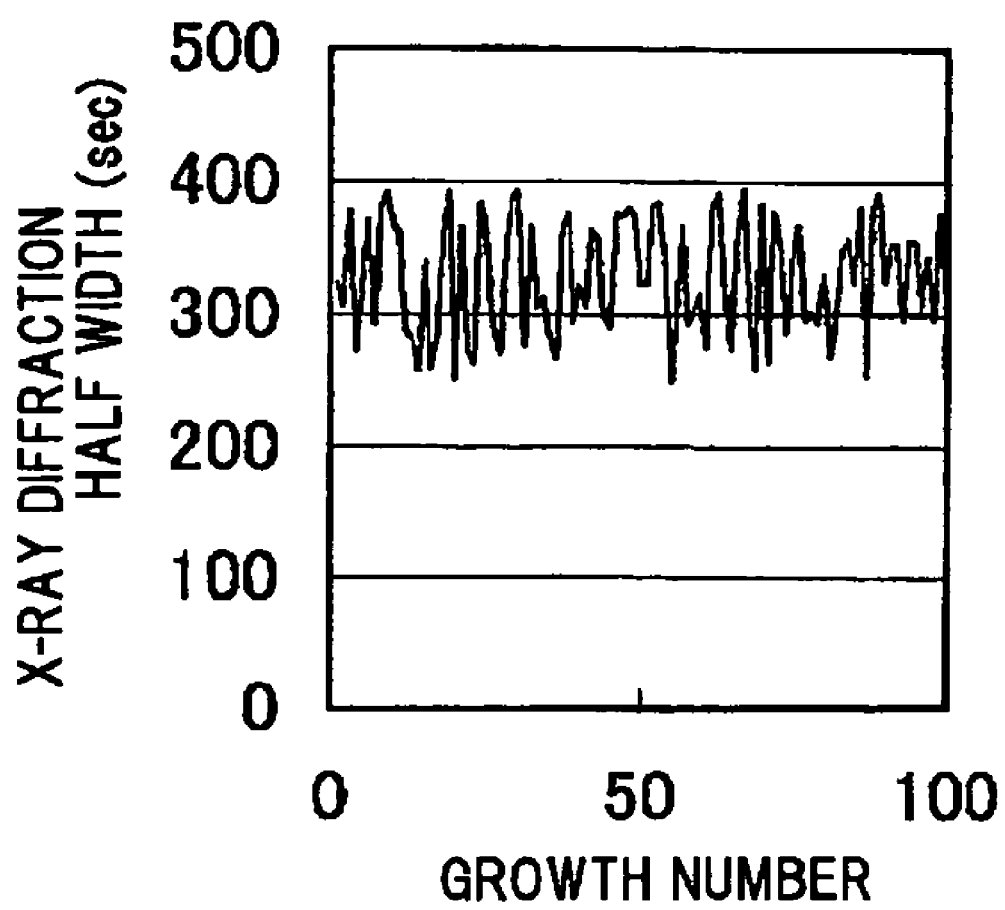
FIG. 8 is a characteristic diagram showing the X-ray diffraction half width of GaN layers in the case that the GaN growth is repeated 100 times under the same conditions according to the two step growth method.

As is apparent from the comparison of characteristics shown in FIGS. 3 and 4 according to the present exemplary embodiment with that shown in FIGS. 7 and 8 according to the conventional two step growth method, it is found that the characteristics of FIGS. 3 and 4 exhibit a significantly small fluctuation (±2% or less with respect to the mean value). The mean value of the thicknesses of the GaN layers is 1.84 μm, and the mean value of the X-ray diffraction half width values of the GaN layers is 265 seconds. Based on the results obtained, the method for producing a GaN layer according to the present exemplary embodiment makes possible to increase the growth rate (namely, improvements in the production efficiency) and to decrease the X-ray diffraction half width (namely, reduction of the dislocation) as compared with the case of the two step growth method (1.5 μm, 265 seconds).

In the above-described exemplary embodiment, the aforesaid plasma is preferably generated by any of Parallel-Plate Plasma equipment, ECR plasma equipment, and ICP plasma equipment.

Moreover, it is preferred that the above-described plasma is gas plasma containing nitrogen atom, and the surface reformation layer 2 is a nitrided layer.

In the present exemplary embodiment, the aforesaid plasma is derived from a mixed gas consisting of a gas containing nitrogen atom and a gas containing silicon atom; and it is possible that the surface reformation layer 2 has also a constitution containing at least Al, N, Si, and O atom. In this case, it is preferred that the above-described gas containing nitrogen atom is any of $N_2$, $NH_3$, and $N_2O$, while the above-described gas containing silicon atom is any of $SiH_4$, $Si_2H_6$, and $SiF_4$.

In the above-described exemplary embodiment, the growth temperature of the GaN layer 3 is preferably 900° C. or more in the region where the GaN layer is grown in contact with the surface reformation layer 2.

Further, in the above-described exemplary embodiment, it is preferred that the introduction of ammonia into a vapor phase growth apparatus is started at a temperature of the sapphire substrate 1 of 800° C. or less in the treatment wherein the temperature of the sapphire substrate 1 is raised up to the growth temperature of the GaN layer 3. The starting temperature of the introduction of ammonia is preferably 300° C. or less, but 100° C. or less is acceptable.

The above-described atmosphere containing ammonia is preferably any of a mixed gas consisting of ammonia and hydrogen, a mixed gas consisting of ammonia and nitrogen, or a mixed gas consisting of ammonia, hydrogen, and nitrogen.

Moreover, the metal-organic vapor phase epitaxy method (MOVPE method) may be replaced by halide vapor phase epitaxy method (HVPE method) in the vapor phase growth.

Effects of the First Embodiment

According to the first exemplary embodiment, the following advantageous effects are obtained.

(1) The surface of the sapphire substrate 1 is plasma-nitrided to form the surface reformation layer 2, the surface reformation layer 2 is made to be nuclei as the origination of crystal growth, and the GaN layer 3 is formed on the surface reformation layer according to a vapor phase growth method, whereby a low production efficiency and the instability of growth being the disadvantages of a two step growth method can be overcome.

(2) Such a treatment that the temperature of the sapphire substrate 1 is raised up to the growth temperature of the GaN layer 3 is conducted in the atmosphere containing ammonia in the case where the GaN layer 3 is formed on the surface reformation layer 2 of the sapphire substrate 1 according to the vapor phase growth method, whereby it becomes possible to prevent a significant fluctuation of the surface reformation layer 2 in every growth steps, so that the GaN layer 3 can be grown stably.

(3) The nitridation treatment is conducted in plasma CVD equipment, and the vapor phase growth is conducted in MOVPE equipment, whereby it becomes possible to execute parallely the nitridation and the growth, and the production efficiency is determined by the MOVPE growth for which a much time is required, consequently, the production efficiency is not affected by the time required for plasma nitridation in this case, resulting in the increase of production efficiency of the GaN layer 3.

In the above-described exemplary embodiment, the temperature raising step from a room temperature to 1100° C. shown in FIG. 2B may be conducted in the atmosphere of an inert gas such as nitrogen or the atmosphere which is prepared by admixing inert gas such as nitrogen with hydrogen having a concentration of 10% or less in place of the atmosphere containing ammonia; and the same advantageous effects as that of the above-described exemplary embodiment can be obtained in also the modification as mentioned above.

Second Embodiment

In accordance with the second exemplary embodiment, the temperature raising treatment shown in FIG. 1B is conducted in a condition wherein only nitrogen is flowed at a constant rate (for example, 100 slm) in a MOVPE apparatus, ammonia, hydrogen, and nitrogen are introduced into the MOVPE apparatus in the stage wherein the temperature of the sapphire substrate 1 is reached to 1100° C. as in the case of the first exemplary embodiment, and further TMG is started to flow (for example, 846 μmol/min.) to begin GaN growth. The other steps are the same as that of the first exemplary embodiment.

According to the second exemplary embodiment, the fluctuations in the thicknesses and X-ray diffraction half widths of the GaN layer 3 are somewhat remarkable (around ±3%), but the stability in growth can be significantly improved as compared with ±20% in case of a conventional two step growth. Furthermore, the mean value of the thicknesses of the GaN layers 3 grown in accordance with the above-described growth condition is 1.7 μm, and a mean value of the X-ray diffraction half widths is 282 seconds. As a consequence, the same advantageous effects as that of the first exemplary embodiment can be obtained.

The mean value of X-ray diffraction half width is 265 seconds in the first exemplary embodiment, and 282 seconds in the second exemplary embodiment. When these GaN layers are used to fabricate light emitting diodes, the optical output equal to or higher than that obtained in accordance with a conventional two step growth method is obtained. From the result obtained, it has been found that a desirable value of the X-ray half width of the GaN layer fabricated in accordance with the present method is 290 seconds or less.

Third Embodiment

In the first exemplary embodiment, mixed gases (total six types) are prepared by such a manner that one type each of gases which are to be introduced into plasma equipment at the time of generating plasma is selected from the following two categories (1) and (2), and these selected gases are admixed with each other in a ratio of 1:1.
(1) $N_2$, $NH_3$, and $N_2O$
(2) $SiH_4$, $Si_2H_6$, and $SiF_4$ Plasma treatments and growth steps are conducted by using these mixed gases in accordance with the steps shown in FIGS. 1A to 1C.

A fluctuation of the mean value of the X-ray diffraction half widths in this case is around 5%. Although the value obtained is higher than that of the first exemplary embodiment, substantially the same values as that of the above-described exemplary embodiments are obtained. In the present case, the reformation state on the sapphire surface is not the simple nitridation unlike the above-described exemplary embodiments, but such that Al, N, Si, or O which has entrained Si from the gas is reformed as the mixed material. Consequently, it is considered that the results of the present exemplary embodiments are somewhat different from those of the above-described respective exemplary embodiments. However, the stability of growth is remarkably improved as compared with that of a conventional two step growth method in even a case where Si comes to be mixed in the gas.

Fourth Embodiment

The fourth exemplary embodiment is that wherein only the temperature raising process is somewhat changed in the first exemplary embodiment. Namely, the gases to be flown in the MOVPE apparatus are selected, for example, to be 50 slm of hydrogen and 50 slm of nitrogen in the first stage of the temperature raising treatment, thereafter, the gases are changed, for example, to be 20 slm of ammonia, 30 slm of hydrogen, and 50 slm of nitrogen in the stage wherein the temperature is reached to a certain temperature T, and the temperature is raised to 1100° C.

In the case where the certain temperature is 100° C. or less, the same results as that of the first exemplary embodiment are obtained. Furthermore, when the certain temperature T is 100 to 300° C. or less, the mean vales of thicknesses of the GaN layers 3 and the X-ray diffraction half widths are substantially the same as those of the first exemplary embodiment. However, the fluctuations thereof become somewhat higher than that of the first exemplary embodiment, and they are around ±3%. These results are significantly lower than that of a conventional two step growth method.

Moreover, when the certain temperature T is in a range of 300 to 800° C., the mean values of the thicknesses and the X-ray diffraction half widths of the GaN layers 3 are deteriorated to that of substantially the same level as that of the two step growth method. However, the fluctuation of them is ±20% or less, so that higher reproducibility of growth than that of the two step growth method is obtained.

Still further, when the certain temperature T is 800° C. or higher, the mean values of the thicknesses and the X-ray diffraction half widths of the GaN layers 3 become worse than that of the two step growth method, besides the fluctuations thereof are ±30% or more, so that they are more remarkable than that of the two step growth method. The reason therefor is in that the surface reformation layer 2 is etched with the hydrogen in an atmosphere as described above.

EXAMPLES

In the following, Examples 1 to 3 of the present invention will be described.

Example 1

The example 1 was implemented by such a manner that only the temperature raising process is somewhat changed in the first exemplary embodiment. Namely, the gases to be flown in the temperature raising treatment were as follows:
(3) 20 slm of ammonia, and 80 slm of hydrogen
(4) or 20 slm of ammonia, and 80 slm of nitrogen
As a result, the same results as that of the above-described first exemplary embodiment were obtained.

Example 2

The present example is the one wherein the growth of the GaN layer 3 was conducted by the use of a HVPE (hydride vapor phase growth) apparatus. The specific growth procedures of the present example will be described hereinafter.

The sapphire substrate 1 which had been nitrided was introduced into the HVPE apparatus, and then, the interior of the HVPE apparatus was depressurized up to $5\times10^{-1}$ Torr by vacuuming. Thereafter, hydrogen was introduced into the HVPE apparatus, whereby the pressure was returned to the atmospheric pressure to clean up the interior of the HVPE apparatus.

Then, 2 slm of ammonia, 3 slm of hydrogen, and 5 slm of nitrogen were introduced into the HVPE apparatus; and the temperature of the sapphire substrate was raised to 1100° C. as shown in FIG. 1B. At the time when the temperature of the sapphire substrate 1 is reached to 1100° C., 500 ccm of the GaCl gas produced by spraying HCl onto the metallic Ga maintained at 800° C. were introduced into the apparatus to start the growth of the GaN layer 3. The growth period of time was 30 minutes. After elapse of 30 minutes, the supply of GaCl was stopped to complete the growth. Thereafter, the temperature of the sapphire substrate 1 was reduced up to a room temperature, and the resulting sapphire substrate 1 was taken out. As a consequence, the same results as that of the first exemplary embodiment were obtained.

Example 3

The present example was implemented by such a manner that the growth of the GaN layer 3 was carried out in a HVPE apparatus in the second exemplary embodiment, and in addition, the following growth procedures were applied.

First, the sapphire substrate 1 which had been nitrided was introduced into a HVPE apparatus, then, the interior of the HVPE apparatus was depressurized up to $5\times10^{-1}$ Torr by vacuuming, thereafter, nitrogen was introduced into the HVPE apparatus thereby to return the pressure to the atmospheric pressure, whereby the ambient in the HVPE apparatus was cleaned up.

Then, the flow rate of nitrogen was adjusted to be 10 slm; and the temperature of the sapphire substrate 1 was raised to 1100° C. At the time when the temperature of the substrate is reached to 1100° C., the gases to be flown into the HVPE apparatus were selected to be 2 slm of ammonia, 3 slm of hydrogen and 5 slm of nitrogen, and further, 500 ccm of the GaCl gas produced by spraying HCl onto the metallic Ga maintained at 800° C. were introduced into the apparatus to start the growth of GaN. The growth period of time was 30 minutes. After elapse of 30 minutes, the supply of GaCl was stopped to complete the growth. Thereafter, the temperature of the substrate was reduced up to a room temperature, and the resulting sapphire substrate 1 was taken out. According to the present example, the same results as that of the second exemplary embodiment were obtained.

Other Embodiments

It should be noted that the present invention is not limited to the above-described respective exemplary embodiments, but a variety of modifications may be made within a scope of the technical idea of the present invention so far as they do neither depart from, nor alter the spirit or essential characteristics thereof.

For instance, the ECR plasma equipment may be replaced by Parallel-Plate Plasma equipment, or ICP plasma equipment in case of forming the surface reformation layer 2 in the above-described respective exemplary embodiment.

Furthermore, ammonia or $N_2O$ may be used instead of [ammonia+hydrogen+nitrogen] for the gases to be introduced in case of forming the surface reformation layer 2. Consequently, the surface reformation layer 2 may be formed irrespective of the type of gases to be used.

In the above-described respective exemplary embodiments, such temperature sequence that the start of the growth according to MOVPE method (i.e. the start of the introduction of TMG) is made during the temperature raising step before the temperature reaches to 1100° C., and then, the temperature increases up to 1100° C. while continuing the growth step may be applied. In this case, if the temperature of growth starting is 90° C. or higher, the same results as that of the above-described respective exemplary embodiments are obtained.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for growing a nitride semiconductor, said method comprising:
   forming a surface reformation layer directly on a sapphire substrate in a lower temperature than a growth temperature of the nitride semiconductor;
   after the forming of the surface reformation layer, raising a temperature of the sapphire substrate with the surface reformation layer formed thereon from the lower temperature than the growth temperature of the nitride semiconductor up to the growth temperature of the nitride semiconductor in an atmosphere including ammonia; and
   growing a nitride semiconductor layer on a surface of the surface reformation layer by using a metal-organic vapor phase epitaxy (MOVPE) method or a halide vapor phase epitaxy (HVPE) method, and
   wherein the surface reformation layer has a thickness in a range of 1 to 10 nm.

2. The method according to claim 1, wherein:
   the surface reformation layer comprises a nitrided layer.

3. The method according to claim 1, wherein forming the surface reformation layer comprises forming the surface reformation layer by plasma irradiation.

4. The method according to claim 3, wherein the surface reformation layer comprises at least Al, N, Si, and O atoms, and
wherein the plasma comprises a gas plasma including a gas containing nitrogen atom and a gas containing silicon atom.

5. The method according to claim 1, wherein growing the nitride semiconductor layer comprises adjusting a growth temperature of a region of the nitride semiconductor layer grown in contact with the surface reformation layer to be not less than 900° C.

6. The method according to claim 1, wherein raising the temperature of the sapphire substrate comprises introducing ammonia when the temperature of the sapphire substrate is not more than 800° C.

7. The method according to claim 1, wherein raising the temperature of the sapphire substrate comprises starting to introduce the ammonia when a temperature of the sapphire substrate is not more than 300° C.

8. The method according to claim 1, wherein growing the nitride semiconductor layer comprises controlling a mean value of an X-ray diffraction half width of the nitride semiconductor layer to be not more than 290 seconds when the nitride semiconductor layer is grown repeatedly 100 times under a same condition.

9. The method according to claim 1, wherein the temperature of the sapphire substrate with the surface reformation layer formed thereon is raised from a room temperature up to the growth temperature of the nitride semiconductor in the atmosphere including ammonia.

10. The method according to claim 1, wherein said growing the nitride semiconductor layer on the surface of the surface reformation layer is performed by the HVPE method.

11. A method for producing a nitride semiconductor, said method comprising:
forming a surface reformation layer directly on a sapphire substrate in a lower temperature than a growth temperature of the nitride semiconductor;
after the forming of the surface reformation layer, raising a temperature of the sapphire substrate with the surface reformation layer formed thereon from the lower temperature than the growth temperature of the nitride semiconductor up to the growth temperature of the nitride semiconductor in an atmosphere including an inert gas, or an atmosphere including the inert gas and hydrogen at a concentration of 10% or less relative to the inert gas; and
growing a nitride semiconductor layer on a surface of the surface reformation layer by using a metal-organic vapor phase epitaxy (MOVPE) method or a halide vapor phase epitaxy (HVPE) method, and
wherein the surface reformation layer has a thickness in a range of 1 to 10 nm.

12. The method according to claim 11, wherein:
the surface reformation layer comprises a nitrided layer.

13. The method according to claim 11, wherein forming the surface reformation layer comprises forming the surface reformation layer by plasma irradiation.

14. The method according to claim 13, wherein the surface reformation layer comprises at least Al, N, Si, and O atoms, and
wherein the plasma comprises a gas plasma including a gas containing nitrogen atom and a gas containing silicon atom.

15. The method according to claim 11, wherein growing the nitride semiconductor layer comprises adjusting a growth temperature of a region of the nitride semiconductor layer grown in contact with the surface reformation layer to be not less than 900° C.

16. The method according to claim 11, wherein raising the temperature of the sapphire substrate comprises introducing the inert gas, or the inert gas and hydrogen at a concentration of 10% or less relative to the inert gas when the temperature of the sapphire substrate is not more than 800° C.

17. The method according to claim 11, wherein raising the temperature of the sapphire substrate comprises starting to introduce the inert gas, or the inert gas and hydrogen at a concentration of 10% or less relative to the inert gas when a temperature of the sapphire substrate is not more than 300° C.

18. The method according to claim 11, wherein growing the nitride semiconductor layer comprises controlling a mean value of an X-ray diffraction half width of the nitride semiconductor layer to be not more than 290 seconds when the nitride semiconductor layer is grown repeatedly 100 times under a same condition.

19. The method according to claim 11, wherein the temperature of the sapphire substrate with the surface reformation layer formed thereon is raised from a room temperature up to the growth temperature of the nitride semiconductor in the atmosphere including the inert gas, or the atmosphere including the inert gas and hydrogen at said concentration of 10% or less relative to the inert gas.

20. The method according to claim 11, wherein said raising the temperature of the sapphire substrate is performed in said atmosphere including the inert gas and hydrogen at said concentration of 10% or less relative to the inert gas.

* * * * *